United States Patent
Mizunuma

(10) Patent No.: US 12,003,014 B2
(45) Date of Patent: Jun. 4, 2024

(54) ANTENNA MODULE AND COMMUNICATION DEVICE

(71) Applicant: Murata Manufacturing Co., Ltd., Kyoto (JP)

(72) Inventor: Ryuken Mizunuma, Kyoto (JP)

(73) Assignee: MURATA MANUFACTURING CO., LTD., Kyoto (JP)

(*) Notice: Subject to any disclaimer, the term of this patent is extended or adjusted under 35 U.S.C. 154(b) by 133 days.

(21) Appl. No.: 17/141,302

(22) Filed: Jan. 5, 2021

(65) Prior Publication Data

US 2021/0126341 A1  Apr. 29, 2021

Related U.S. Application Data

(63) Continuation of application No. PCT/JP2019/025919, filed on Jun. 28, 2019.

(30) Foreign Application Priority Data

Jul. 6, 2018 (JP) .................................. 2018-129515

(51) Int. Cl.
*H01Q 1/22* (2006.01)
*H01Q 1/52* (2006.01)
(Continued)

(52) U.S. Cl.
CPC ......... *H01Q 1/2283* (2013.01); *H01Q 1/2266* (2013.01); *H01Q 1/526* (2013.01); *H01Q 9/0421* (2013.01); *H01Q 5/357* (2015.01)

(58) Field of Classification Search
CPC .... H01Q 1/2283; H01Q 1/2266; H01Q 1/526; H01Q 9/0421; H01Q 5/357;
(Continued)

(56) References Cited

U.S. PATENT DOCUMENTS 11,450,965 B2 * 9/2022 Shibata ................ H01Q 19/005
2006/0055601 A1  3/2006 Kameda et al.
(Continued)

FOREIGN PATENT DOCUMENTS

JP  H11289215 A  10/1999
JP  2001060823 A  3/2001
(Continued)

OTHER PUBLICATIONS

International Search Report issued in Application No. PCT/JP2019/025919, dated Sep. 10, 2019.
(Continued)

*Primary Examiner* — Hai V Tran
*Assistant Examiner* — Michael M Bouizza
(74) *Attorney, Agent, or Firm* — Pearne & Gordon LLP

(57) ABSTRACT

An antenna module includes a substrate that includes a first dielectric layer and a second dielectric layer with a dielectric constant different from a dielectric constant of the first dielectric layer, a first antenna that is disposed on or in the first dielectric layer and transmits and receives a signal in a first frequency band, a second antenna that is disposed on or in the second dielectric layer and transmits and receives a signal in a second frequency band which is a lower frequency band than the first frequency band, and a radio frequency circuit that is disposed on or in the substrate and is electrically connected to the first antenna.

17 Claims, 12 Drawing Sheets

(51) Int. Cl.
*H01Q 9/04* (2006.01)
*H01Q 5/357* (2015.01)

(58) Field of Classification Search
CPC .. H01Q 21/062; H01Q 21/065; H01Q 25/005; H01P 1/20345; H01L 23/14
See application file for complete search history.

(56) References Cited

U.S. PATENT DOCUMENTS

| | | |
|---|---|---|
| 2007/0296635 A1 | 12/2007 | Popugaev et al. |
| 2015/0070228 A1 | 3/2015 | Gu et al. |
| 2017/0222316 A1* | 8/2017 | Mizunuma ............ H01Q 21/062 |
| 2017/0317418 A1* | 11/2017 | Garcia ................. H01Q 9/0407 |
| 2017/0365912 A1 | 12/2017 | Su et al. |
| 2019/0173167 A1* | 6/2019 | Ariumi .................. H01Q 23/00 |

FOREIGN PATENT DOCUMENTS

| | | |
|---|---|---|
| JP | 2001-127529 A | 5/2001 |
| JP | 2004-040597 A | 2/2004 |
| JP | 2006270575 A | 10/2006 |
| JP | 2017229055 A | 12/2017 |

OTHER PUBLICATIONS

Written Opinion issued in Application No. PCT/JP2019/025919, dated Sep. 10, 2019.
Japanese Office action for Application No. 2020-528842 dated Aug. 3, 2021.

\* cited by examiner

ANTENNA MODULE AND COMMUNICATION DEVICE

CROSS REFERENCE TO RELATED APPLICATION

This is a continuation of International Application No. PCT/JP2019/025919 filed on Jun. 28, 2019 which claims priority from Japanese Patent Application No. 2018-129515 filed on Jul. 6, 2018. The contents of these applications are incorporated herein by reference in their entireties.

BACKGROUND OF THE DISCLOSURE

Field of the Disclosure

The present disclosure relates to an antenna module and a communication device.

Description of the Related Art

Patent Document 1 discloses an antenna that transmits and receives two signals of different frequencies. In the antenna disclosed in Patent Document 1, dielectric substrates with different dielectric constants are disposed on both sides of a main conductive plate, and antenna elements of different sizes are formed on the dielectric substrates in a one-to-one relation. A common metal plate for short-circuiting the main conductive plate and the two antenna elements is disposed, and an antenna feed line is disposed in each of the dielectric substrate.

Patent Document 1: Japanese Unexamined Patent Application Publication No. 11-289215

BRIEF SUMMARY OF THE DISCLOSURE

In an antenna module, an antenna and an external RFIC need to be connected to each other. In Patent Document 1, however, the RFIC is not disposed on the dielectric substrate. Accordingly, in trying to realize an antenna module for transmitting and receiving signals in a millimeter wave band and a microwave band with the configuration disclosed in Patent Document 1, there is a possibility that the length of a feed line connecting an antenna for the millimeter wave band and the external RFIC increases. This may increase a signal attenuation caused by wiring in some cases when the signal in the millimeter wave band is transmitted and received.

An object of the present disclosure is to provide an antenna module and a communication device that can transmit and receive a plurality of signals of different frequencies, and that can suppress an increase in the attenuation of the signal transferred between a radio frequency circuit and an antenna.

An antenna module according to one aspect of the present disclosure includes a substrate that includes a first dielectric layer and a second dielectric layer with a dielectric constant different from a dielectric constant of the first dielectric layer, a first antenna that is disposed on or in the first dielectric layer and transmits and receives a signal in a first frequency band, a second antenna that is disposed on or in the second dielectric layer and transmits and receives a signal in a second frequency band which is a lower frequency band than the first frequency band, and a radio frequency circuit that is disposed on or in the substrate and is electrically connected to the first antenna.

A communication device according to another aspect of the present disclosure includes the antenna module mentioned above, a mother board, a millimeter wave circuit that is disposed on or in the mother board and is connected to the antenna module, and a microwave circuit that is disposed on or in the mother board and is connected to the antenna module.

With the antenna module and the communication device according to the present disclosure, a plurality of signals of different frequencies can be transmitted and received, and an increase in the attenuation of the signal transferred between the radio frequency circuit and the antenna can be suppressed.

DETAILED DESCRIPTION OF THE DISCLOSURE

Embodiments of an antenna module and a communication device according to the present disclosure will be described in detail below with reference to the drawings. The present disclosure is not restricted by the following embodiments. It is needless to say that the following embodiments are merely illustrative and constituent elements disclosed in the different embodiments can be partly replaced or combined with each other. In the first and subsequent modifications, the description of the matters common to those in the embodiment is omitted, and only the different points are described. In particular, similar operations and advantageous effects obtained with similar configurations are not repeatedly described for each of the embodiments.

Embodiment

Figure 1:
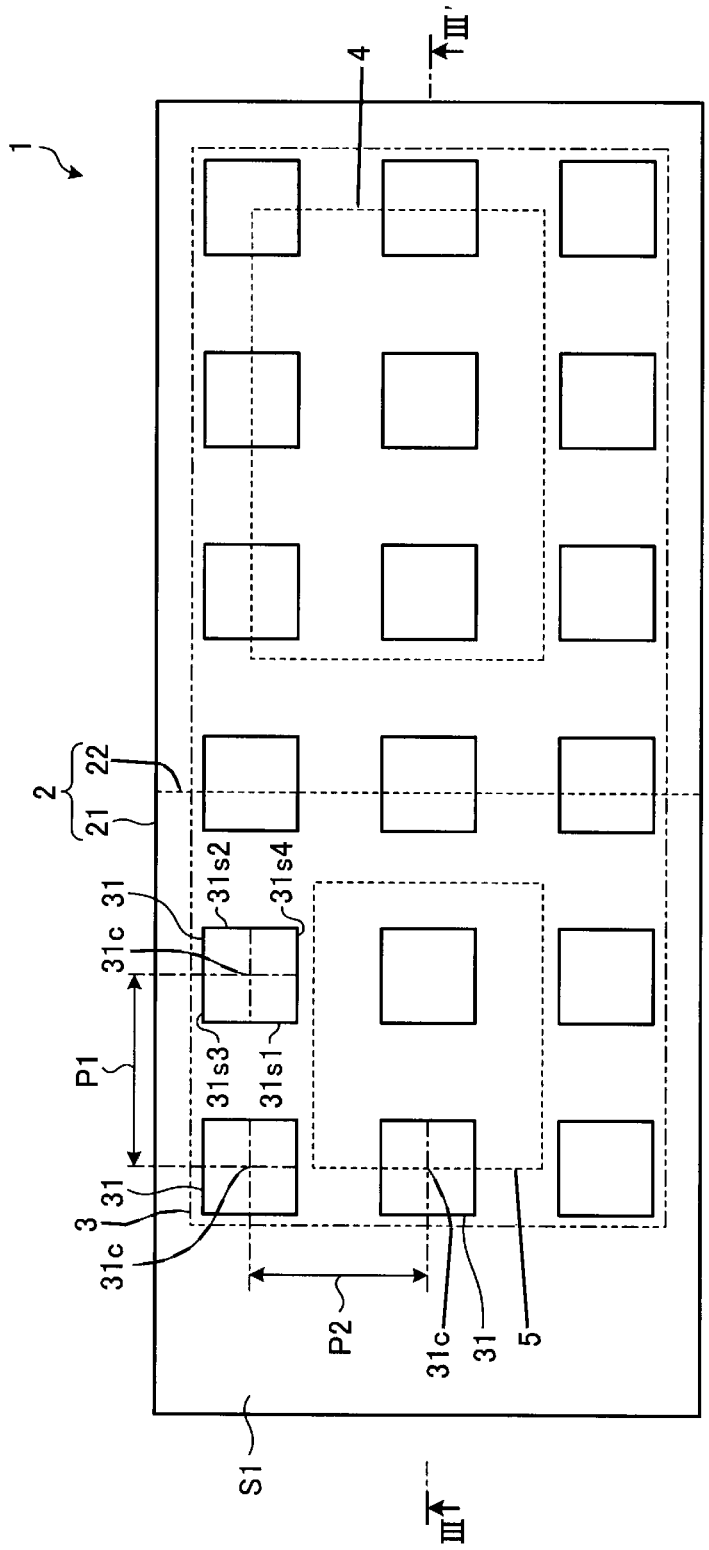
FIG. 1 is a plan view of an antenna module according to an embodiment.
Figure 2:
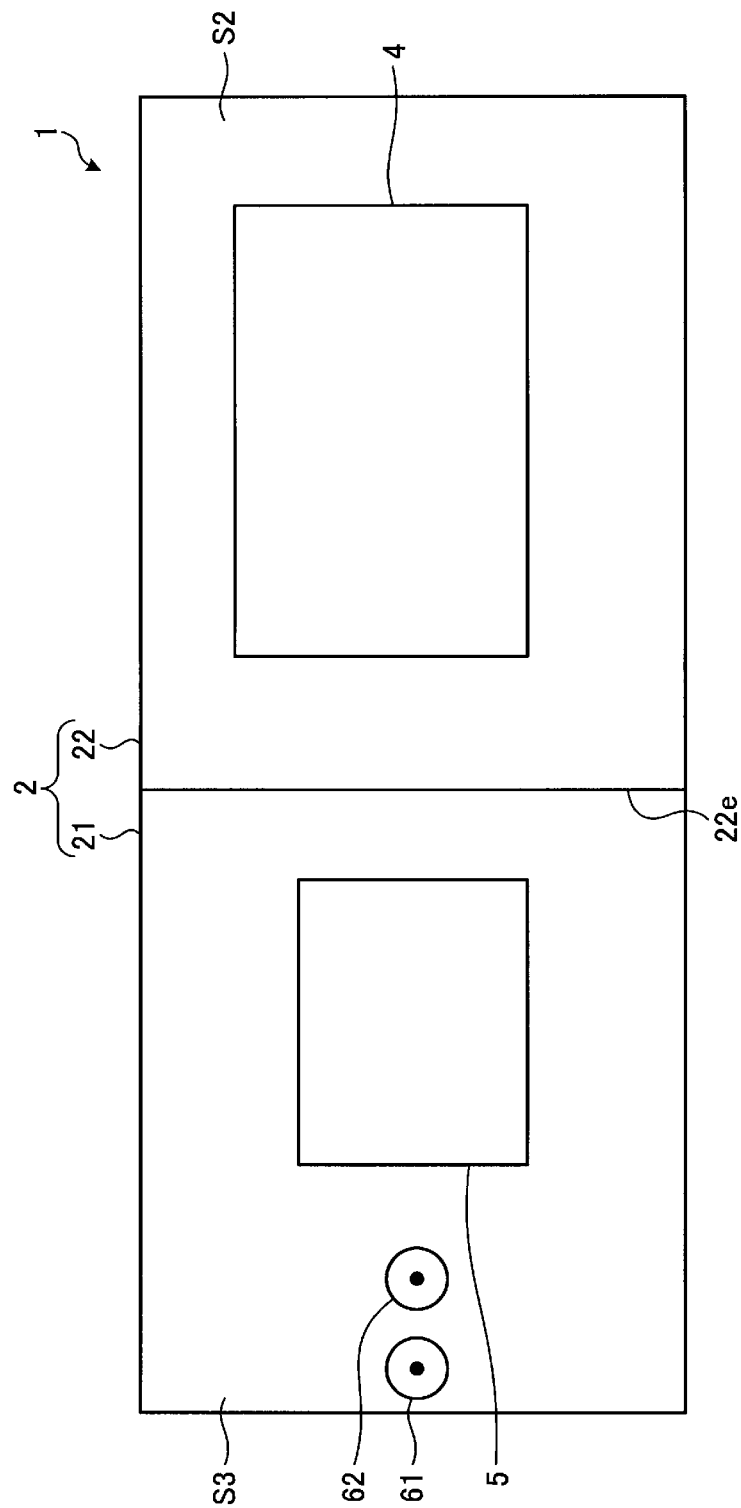
FIG. 2 is a bottom view of the antenna module according to the embodiment.
Figure 3:
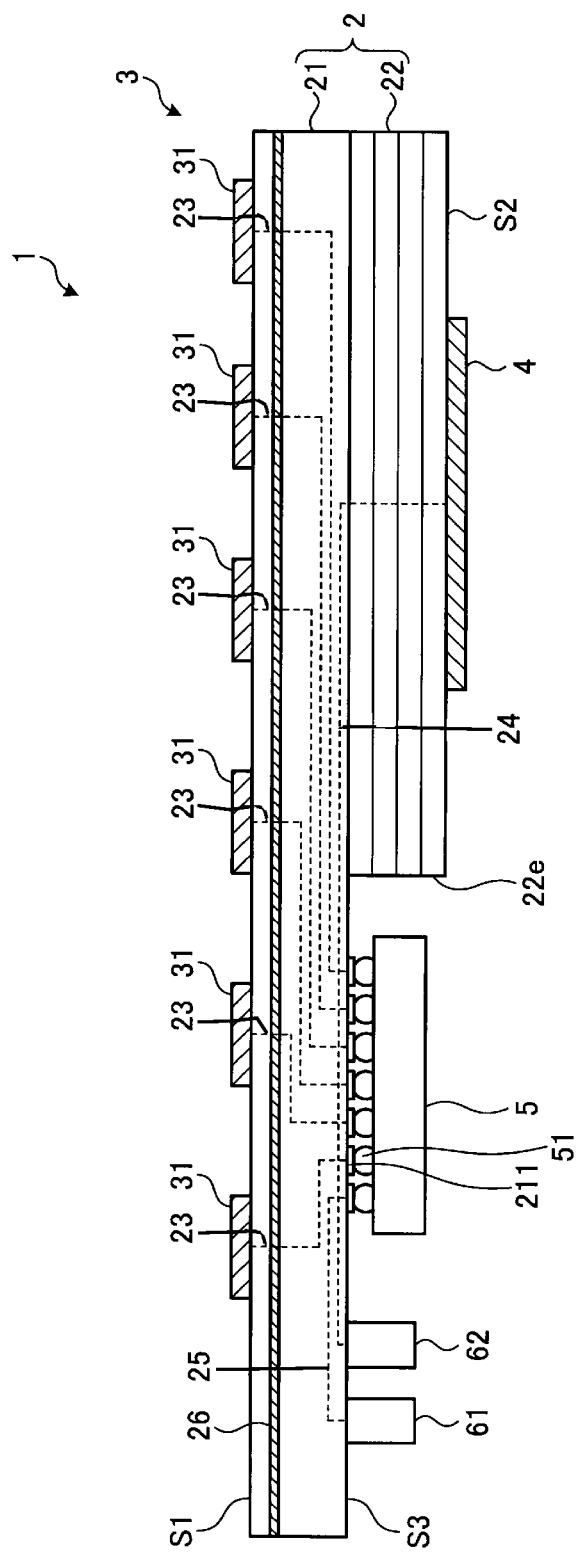
FIG. 3 is a sectional view taken along a line III-III' in FIG. 1.

FIG. 1 is a plan view of an antenna module according to an embodiment. FIG. 2 is a bottom view of the antenna module according to the embodiment. FIG. 3 is a sectional view taken along a line III-III' in FIG. 1. As illustrated in FIGS. 1 to 3, the antenna module 1 includes a substrate 2, a first antenna 3, a second antenna 4, and a radio frequency circuit 5.

The antenna module 1 according to this embodiment is an antenna-equipped radio frequency module to which the radio frequency circuit 5 is mounted. The antenna module 1 performs, for example, transmission and reception of signals in a submillimeter wave band to a millimeter wave band of 24 GHz or higher and 75 GHz or lower, and transmission and reception of signals in a microwave band of 10 GHz or lower. The signals in the submillimeter wave band to the millimeter wave band include signals in a 28-GHz band, a 39-GHz band, and a 60-GHz band, and are used in, for example, the 5th generation cellular system and the 60-GHz band Wi-Fi (11ad system). The signals in the microwave band are used in the cellular system, 2.4-GHz/5-GHz band Wi-Fi, Bluetooth (registered trademark), GPS, NFC, and so on. In the following description, a frequency band ranging from the submillimeter wave band to the millimeter wave band is referred to as a millimeter wave band.

As illustrated in FIG. 3, the substrate 2 includes a first dielectric layer 21 and a second dielectric layer 22. The first dielectric layer 21 and the second dielectric layer 22 are each in the form of a multilayer substrate. The second dielectric layer 22 has a dielectric constant different from that of the first dielectric layer 21. More specifically, the dielectric constant of the second dielectric layer 22 is higher than that of the first dielectric layer 21. One or more among Low Temperature Cofired Ceramics (hereinafter referred to as "LTCC"), a glass epoxy resin, a liquid crystal polymer, a fluororesin, a polyimide resin, and so on are used as the materials for each of the first dielectric layer 21 and the second dielectric layer 22. Among the above-described materials, the LTCC has a maximum dielectric constant, and the dielectric constant gradually decreases in order of the glass epoxy resin, the liquid crystal polymer, and the fluororesin.

In the substrate 2, the first dielectric layer 21 and the second dielectric layer 22 made of different types of materials can be combined with each other. For example, the LTCC is used as the material of the second dielectric layer 22 with a high dielectric constant, and the liquid crystal polymer is used as the material of the first dielectric layer 21 with a low dielectric constant. The combination of the materials used as the first dielectric layer 21 and the second dielectric layer 22 can be changed as appropriate. Thus, the dielectric constant of the first dielectric layer 21 and the dielectric constant of the second dielectric layer 22 can easily be made different from each other by using different types of materials to form the first dielectric layer 21 and the second dielectric layer 22.

Instead, the first dielectric layer 21 and the second dielectric layer 22 may be made of the same one type among the above-mentioned materials, and compositions of those two layers may be set to be different from each other. For example, LTCC with a high dielectric constant is used as the material of the first dielectric layer 21, and LTCC with a low dielectric constant is used as the material of the second dielectric layer 22. The LTCC with the high dielectric constant and the LTCC with the low dielectric constant are different in, for example, compositions and contents of their ceramic materials. In this case, since the same type material is used as the first dielectric layer 21 and the second dielectric layer 22, it is easier to manufacture the antenna module 1.

As illustrated in FIG. 3, the first dielectric layer 21 and the second dielectric layer 22 are disposed to overlap with each other in a thickness direction. As illustrated in FIGS. 1 and 2, the first dielectric layer 21 has a larger area than the second dielectric layer 22 in a plan view. Here, the substrate 2 has a first principal surface S1, a second principal surface S2, and a third principal surface S3. The first principal surface S1 is one of the surfaces of the first dielectric layer 21, the one surface being positioned on an opposite side to another surface on which the second dielectric layer 22 is disposed. The second principal surface S2 is one of the surfaces of the second dielectric layer 22, the one surface being positioned on an opposite side to another surface on which the first dielectric layer 21 is disposed. The third principal surface S3 is a surface positioned on an opposite side to the first principal surface S1 of the first dielectric layer 21. A portion of the third principal surface S3 on which the second dielectric layer 22 is not disposed extends outward from an end portion 22e of the second dielectric layer 22 in a plan view.

The first antenna 3 is disposed on the first principal surface S1 of the first dielectric layer 21 and transmits and receives a signal in a millimeter wave band. As illustrated in FIG. 1, the first antenna 3 is an array antenna including a plurality of radiation elements 31 that are arrayed in a matrix pattern. The radiation elements 31 are arrayed at an arrangement pitch P1 in a row direction and at an arrangement pitch P2 in a column direction. Here, each of the arrangement pitches P1 and P2 indicates an interval between centers 31c of gravity of the adjacent radiation elements 31. Each of the radiation elements 31 has sides 31s1 and 31s2 opposing to each other and sides 31s3 and 31s4 positioned between the sides 31s1 and 31s2. The center 31c of gravity coincides with an intersection between an imaginary line connecting a midpoint of the side 31s1 and a midpoint of the side 31s2 and an imaginary line connecting a midpoint of the side 31s3 and a midpoint of the side 31s4. The arrangement pitches P1 and P2 are about ½ of a wavelength λ of the signal transmitted and received by the radiation elements 31.

As illustrated in FIG. 3, the second antenna 4 is disposed on the second principal surface S2 of the second dielectric layer 22 and transmits and receives a signal in a microwave band. The second antenna 4 is a patch antenna constituted by one radiation element. However, the second antenna 4 is not limited to the patch antenna, and it may be a monopole antenna or an inverted-F antenna. A matching member to establish proper matching of the second antenna 4 may be mounted to the first dielectric layer 21.

Because the arrangement pitches P1 and P2 of the radiation elements 31 of the first antenna 3 are ½ of the wavelength λ corresponding to the signal frequency, a total area of the first antenna 3 for transmitting and receiving the signal in the millimeter wave band is determined depending on the number and the arrangement of the radiation elements 31. On the other hand, the second antenna 4 for transmitting and receiving the signal in the microwave band is not an array antenna. The second antenna 4 is disposed on the second dielectric layer 22 with the dielectric constant higher than that of the first dielectric layer 21. Therefore, an area of the second antenna 4 can be reduced due to a wavelength shortening effect in comparison with the case in which the second antenna 4 is disposed on the first dielectric layer 21.

Furthermore, a ground layer 26 is disposed as an inner layer included in the first dielectric layer 21. The second antenna 4 is a patch antenna constituted by one radiation element and is arranged opposite to the ground layer 26. The ground layer 26 is disposed between the first antenna 3 and the second antenna 4 opposing to each other. In the antenna module 1, the ground layer 26 can be shared by the first antenna 3 and the second antenna 4.

The ground layer 26 is disposed in the first dielectric layer 21, and the spacing between the second antenna 4 and the ground layer 26 is relatively large. Therefore, a broader signal band can be realized, and the characteristics of the second antenna 4 for transmitting and receiving the signal in the microwave band are improved in comparison with the case in which the ground layer 26 is disposed at a boundary between the first dielectric layer 21 and the second dielectric layer 22 or in the second dielectric layer 22. In addition, the interference between the signal in the millimeter wave band transmitted and received by the first antenna 3 and the signal in the microwave band transmitted and received by the second antenna 4 can be suppressed with the presence of the ground layer 26.

The configuration of the antenna module 1 is not limited to an illustrated example in which the first antenna 3 is disposed on the first principal surface S1 of the first dielectric layer 21 in an exposed state and the second antenna 4 is disposed on the second principal surface S2 of the second dielectric layer 22 in an exposed state. In another example, the first antenna 3 and the second antenna 4 may be disposed at inner layers included in the first dielectric layer 21 and the second dielectric layer 22, respectively. In still another example, protective layers may be disposed to cover the first antenna 3 and the second antenna 4. Furthermore, the shape, the number, and the arrangement of the radiation elements 31 are not limited to those ones illustrated in FIG. 1, and they may be changed as appropriate.

The radio frequency circuit 5, a first connector 61, and a second connector 62 are disposed on the third principal surface S3 of the first dielectric layer 21. The radio frequency circuit 5 is disposed on the third principal surface S3 of the first dielectric layer 21 in an exposed state. The radio frequency circuit 5 is mounted to a plurality of terminals 211 with a plurality of bumps 51 interposed therebetween by flip-chip bonding, for example. The radio frequency circuit 5 is a RFIC (Radio Frequency Integrated Circuit) including a switch for switching between transmission and reception, a power amplifier, a low-noise amplifier, a phase shifter, a demultiplexer, a coupler, a mixer, and so on.

As illustrated in FIG. 3, the radio frequency circuit 5 and the second dielectric layer 22 are disposed on the same surface, namely the third principal surface S3 of the first dielectric layer 21. The radio frequency circuit 5 is arranged adjacent to the end portion 22e of the second dielectric layer 22. The ground layer 26 is disposed between the radio frequency circuit 5 and the first antenna 3 (the radiation elements 31) in a direction perpendicular to the first principal surface S1. Furthermore, as illustrated in FIG. 2, the first connector 61 and the second connector 62 are disposed on an outer peripheral side of the first dielectric layer 21 in a plan view. In other words, the radio frequency circuit 5 is arranged between both the first connector 61 and the second connector 62 and the end portion 22e of the second dielectric layer 22. Moreover, as illustrated in FIG. 1, at least part of the radiation elements 31 is disposed in a region overlapping with the radio frequency circuit 5 and the second antenna 4 in a plan view.

As illustrated in FIG. 3, the radio frequency circuit 5 is electrically connected to the first antenna 3 and the first connector 61. More specifically, a plurality of first signal paths 23 and a connection path 25 are disposed in the first dielectric layer 21. One-side ends of the first signal paths 23 are connected to the radiation elements 31 on the first principal surface S1, and opposite-side ends of the first signal paths 23 are connected to the radio frequency circuit 5 on the third principal surface S3. Openings (not illustrated) are formed in portions of the ground layer 26 through which the first signal paths 23 pass, thus making the first signal paths 23 and the ground layer 26 electrically isolated from each other. In addition, one end of the connection path 25 is connected to the first connector 61 on the third principal surface S3, and the other end of the connection path 25 is connected to the radio frequency circuit 5 on the third principal surface S3.

The second antenna 4 is electrically connected to the second connector 62. More specifically, a second signal path 24 is disposed to extend through both the first dielectric layer 21 and the second dielectric layer 22. One end of the second signal path 24 is connected to the second antenna 4 on the second principal surface S2, and the other end of the second signal path 24 is connected to the second connector 62 on the third principal surface S3. The first connector 61 and the second connector 62 are each, for example, a coaxial connector that can be connected to a coaxial cable. Instead, the first connector 61 and the second connector 62 may be each a multipole connector or a connector formed by a flexible substrate. At least one of the first connector 61 and the second connector 62 may be disposed on the first principal surface S1. In such a case, a degree of freedom in mounting of the antenna module 1 is increased.

The first signal paths 23 and the connection path 25 include a plurality of vias for the connection between adjacent layers included in the first dielectric layer 21, and wirings disposed in an inner layer or a surface layer of the first dielectric layer 21. The second signal path 24 includes a plurality of vias for the connection between adjacent layers included in the first dielectric layer 21, a plurality of vias for the connection between adjacent layers included in the second dielectric layer 22, and wirings disposed in the first dielectric layer 21 and the second dielectric layer 22. At least part of the connection path 25 and the second signal path 24 may be disposed in an inner layer included in the first dielectric layer 21 or on the third principal surface S3 of the first dielectric layer 21.

The first connector 61 is connected, through a cable, to a base band IC and an IF transceiver IC that are used to transmit and receive the signal in the millimeter wave band. The second connector 62 is connected, through a cable, to a RFIC (Radio Frequency Integrated Circuit) that is used to transmit and receive the signal in the microwave band.

When the signal in the millimeter wave band is transmitted, the radio frequency circuit 5 up-converts an IF or IQ signal or a millimeter wave signal by the mixer as required, amplifies a radio frequency signal in the millimeter wave band by the power amplifier in the radio frequency circuit 5, and then supplies the amplified signal to the first antenna 3. In another example, the radio frequency circuit 5 amplifies the radio frequency signal in the millimeter wave band by the power amplifier in the radio frequency circuit 5, and then supplies the amplified signal to the first antenna 3. With the supply of the high frequency signal, a current is caused to flow through the radiation elements 31 in a predetermined direction, and a polarized wave parallel to a direction of current flow is radiated. As a result, the first antenna 3 transmits the signal in the millimeter wave band. The antenna module 1 can provide a desired radiation pattern (directivity) by controlling the arrangement of the radiation elements 31 and an amplitude and a phase of the radio frequency signal to be excited. When the signal in the millimeter wave band is received, the radio frequency circuit 5 amplifies a radio frequency signal, which has been received by the first antenna 3, by the low-noise amplifier, and then supplies the amplified signal to the base band IC and the IF transceiver IC after down-conversion if required.

When the signal in the microwave band is transmitted, the RFIC in an external circuit supplies a radio frequency signal in the microwave band to the second antenna 4 through the second connector 62 and the second signal path 24. As a result, the second antenna 4 transmits the signal in the microwave band. Furthermore, a signal received by the second antenna 4 is supplied to the RFIC in the external circuit through the second signal path 24 and the second connector 62.

As described above, the antenna module 1 according to this embodiment includes the substrate 2, the first antenna 3, the second antenna 4, and the radio frequency circuit 5. The substrate 2 includes the first dielectric layer 21 and the second dielectric layer 22 with the dielectric constant different from that of the first dielectric layer 21. The first antenna 3 is disposed on the first dielectric layer 21 and transmits and receives the signal in the millimeter wave band (first frequency band). The second antenna 4 is disposed on the second dielectric layer 22 and transmits and receives the signal in the microwave band (second frequency band) that is a lower frequency band than the millimeter wave band. The radio frequency circuit 5 is disposed on or in the substrate 2 and is electrically connected to the first antenna 3.

Furthermore, in the antenna module 1 according to this embodiment, the dielectric constant of the second dielectric layer 22 is higher than that of the first dielectric layer 21.

With the above-described feature, according to the antenna module 1, the signals of different frequencies in the millimeter wave band and the microwave band can be transmitted and received. Moreover, an increase in the attenuation of the signal transferred between the radio frequency circuit 5 and the first antenna 3 can be suppressed in comparison with the case in which the first antenna 3 is disposed on the second dielectric layer 22. Hence, the antenna module 1 can transmit and receive the signals of different frequencies in the millimeter wave band and the microwave band, and can suppress the increase in the attenuation of the signal in the millimeter wave band, which is transferred between the radio frequency circuit 5 and the first antenna 3.

In the antenna module 1 according to this embodiment, the first dielectric layer 21 has a larger area than the second dielectric layer 22 in a plan view. The radio frequency circuit 5 is disposed on the third principal surface S3 of the first dielectric layer 21, the third principal surface S3 being exposed without being covered with the second dielectric layer 22.

With the above-described feature, according to the antenna module 1, the first antenna 3, the second antenna 4, and the radio frequency circuit 5 can be disposed on or in the substrate 2 while an increase in the module size is suppressed. In other words, it is possible to realize the antenna module 1 capable of transmitting and receiving the signals of different frequencies in the millimeter wave band and the microwave band.

In the antenna module 1 according to this embodiment, the radio frequency circuit 5 is disposed on the first dielectric layer 21. The first signal paths 23 connecting the first antenna 3 and the radio frequency circuit 5 are disposed in the first dielectric layer 21 without passing through the second dielectric layer 22.

Hence, the increase in the attenuation of the signal in the millimeter wave band, which is transferred between the radio frequency circuit 5 and the first antenna 3, can be suppressed in comparison with the case in which the radio frequency circuit 5 is disposed on the second dielectric layer 22.

In the antenna module 1 according to this embodiment, the second connector 62 electrically connected to the second antenna 4 is disposed on the first dielectric layer 21.

With the above-described feature, the RFIC in the external circuit can supply the radio frequency signal in the microwave band to the second antenna 4 through the second connector 62 and the second signal path 24.

(First Modification)

Figure 4:
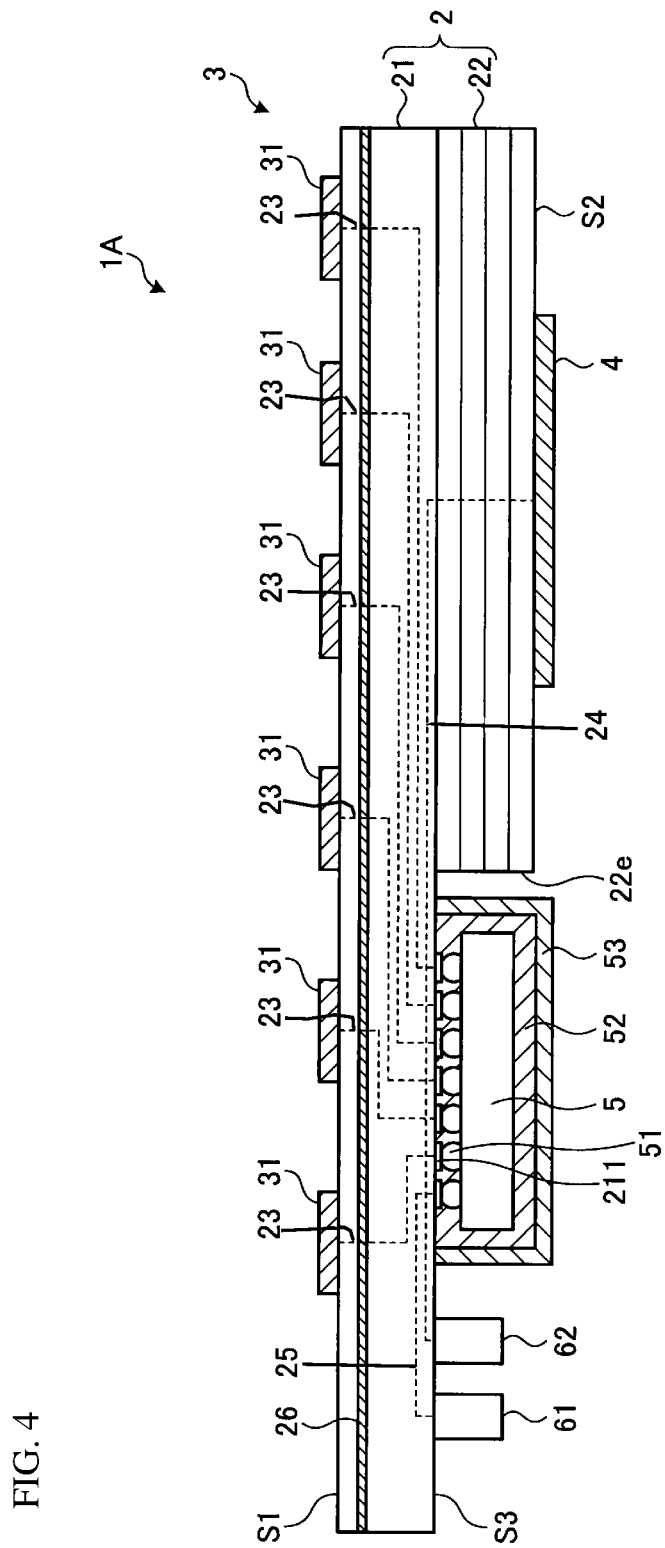
FIG. 4 is a sectional view of an antenna module according to a first modification.

FIG. 4 is a sectional view of an antenna module according to a first modification. The first modification is described in connection with a configuration in which a resin 52 and a shield layer 53 are disposed unlike the above-described embodiment. As illustrated in FIG. 4, the antenna module 1A includes the resin 52 that encapsulates the radio frequency circuit 5. A composite resin, namely a thermosetting resin containing inorganic filler, is used as the resin 52. For example, an epoxy resin, a phenol resin, a cyanate resin, or the like is used as the thermosetting resin. Aluminum oxide, silica, titanium dioxide, or the like is used as the inorganic filler. A resin molding technology, such as a potting technology, a transfer technology, or a compression molding technology, for example, is used to form the resin 52.

The shield layer 53 is disposed on a surface of the resin 52. A conductive metal material is used as the shield layer 53. The shield layer 53 is connected to a ground potential formed in the second dielectric layer 22. As a result, the antenna module 1A can protect the radio frequency circuit 5 and can suppress the interference between the signal radiated from the second antenna 4 and the radio frequency circuit 5. A structure using a shield case may be adopted instead of using the shield layer 53. On that occasion, the resin 52 may be omitted. The shield case is made of a metal.

(Second Modification)

Figure 5:
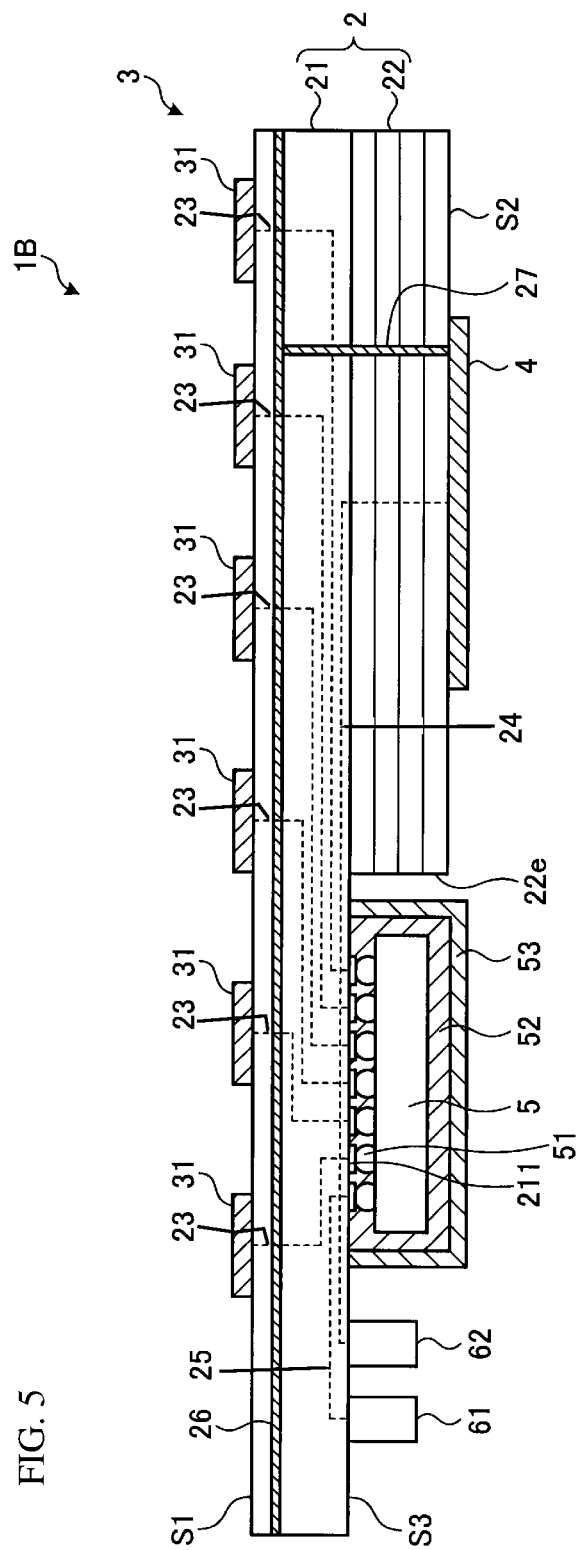
FIG. 5 is a sectional view of an antenna module according to a second modification.

FIG. 5 is a sectional view of an antenna module according to a second modification. The second modification is described in connection with a configuration in which the second antenna 4 is connected to the ground layer 26 unlike the above-described embodiment. As illustrated in FIG. 5, the antenna module 1B includes a ground connection path 27 that connects the second antenna 4 and the ground layer 26. The ground connection path 27 is disposed to penetrate through the first dielectric layer 21 and the second dielectric layer 22 between the second antenna 4 and the ground layer 26.

Since the second antenna 4 is connected to the ground layer 26, a path of a current flowing through the second antenna 4 with supply of the signal from the second connector 62 and the second signal path 24 is changed from that formed in the case in which the second antenna 4 is electrically isolated from the ground layer 26. As a result, the radiation characteristics of the signal radiated from the second antenna 4 are improved in a direction parallel to the second principal surface S2.

(Third Modification)

Figure 6:
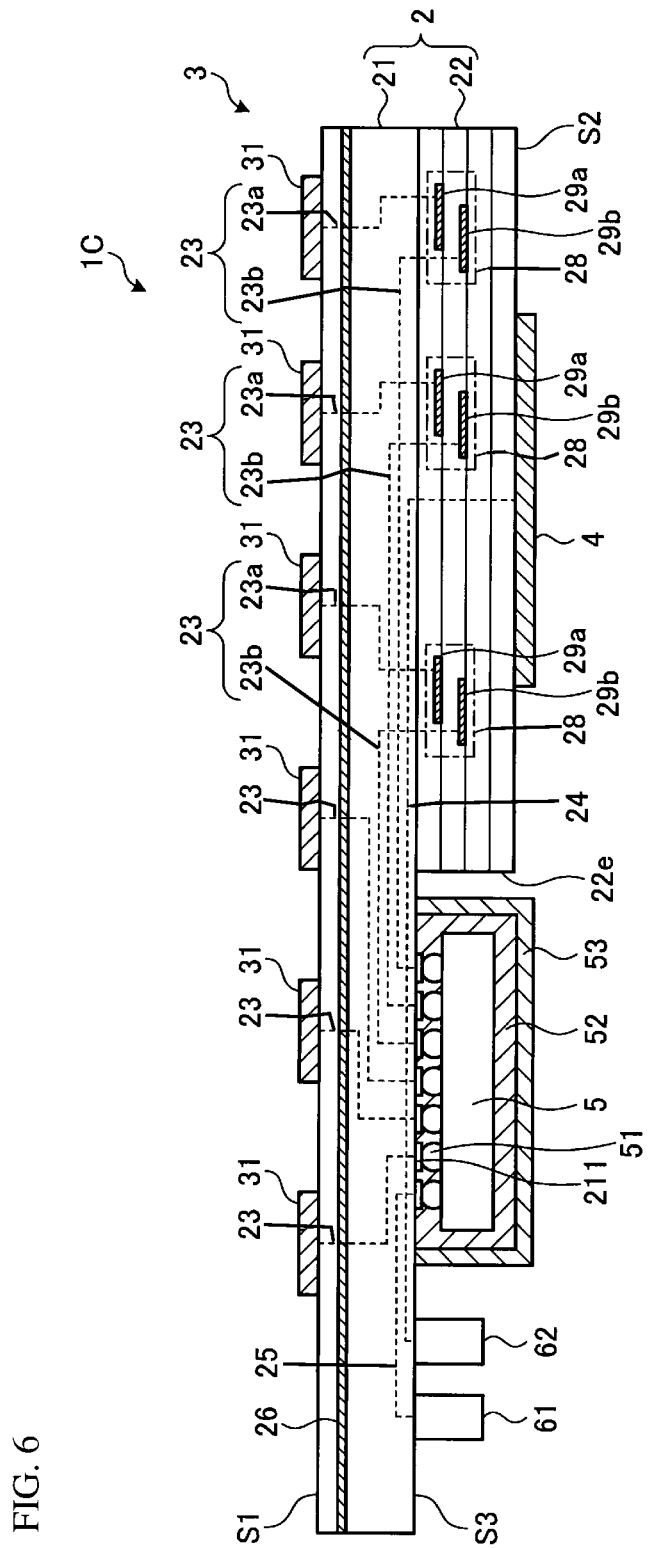
FIG. 6 is a sectional view of an antenna module according to a third modification.

FIG. 6 is a sectional view of an antenna module according to a third modification. The third modification is described in connection with a configuration in which a filter circuit 28 is disposed in the second dielectric layer 22 unlike the above-described embodiment. In the antenna module 1C, as illustrated in FIG. 6, the filter circuit 28 includes opposing electrodes 29a and 29b and wirings connected to the opposing electrodes 29a and 29b. The opposing electrodes 29a and 29b are positioned opposite to each other with at least one dielectric layer in the second dielectric layer 22 interposed therebetween. The filter circuit 28 is constituted by a capacitance component that is formed by the opposing electrodes 29a and 29b, and an inductor component of the wirings that are connected to the opposing electrodes 29a and 29b. The filter circuit 28 is a high-pass filter (HPF) allowing at least a signal in a frequency range not lower than frequencies of the millimeter wave band to pass. Although not illustrated, the wirings connected to the opposing electrodes 29a and 29b function as inductors.

In this modification, the second dielectric layer 22 and the radio frequency circuit 5 are disposed adjacent to each other on the third principal surface S3 of the first dielectric layer 21. Each of the first signal paths 23 is disposed in the first dielectric layer 21 and the second dielectric layer 22 and connects the radiation element 31, the filter circuit 28, and the radio frequency circuit 5. More specifically, each first signal path 23 includes a first partial signal path 23a and a second partial signal path 23b. The first partial signal path 23a is disposed to extend through both the first dielectric layer 21 and the second dielectric layer 22. One end of the first partial signal path 23a is connected to the radiation element 31, and the other end of the first partial signal path 23a is connected to one 29a of the opposing electrodes. The second partial signal path 23b is disposed to extend through both the first dielectric layer 21 and the second dielectric layer 22. One end of the second partial signal path 23b is connected to the radio frequency circuit 5, and the other end of the second partial signal path 23b is connected to the other 29b of the opposing electrodes.

With the above-described configuration, since the filter circuit 28 is formed in the second dielectric layer 22 with the high dielectric constant, the size of the filter circuit 28 can be reduced in comparison with that in the case in which the filter circuit 28 is disposed in the first dielectric layer 21. Furthermore, the filter circuit 28 can eliminate partial components of the signal transferred between the radio frequency circuit 5 and the first antenna 3, the partial components having frequencies lower than the millimeter wave band. As a result, the antenna module 1C can suppress the interference between the signal transmission and reception by the first antenna 3 and the signal transmission and reception by the second antenna 4. The filter circuit 28 is not limited to the high pass filter and may be a band pass filter, for example.

(Fourth Modification)

Figure 7:
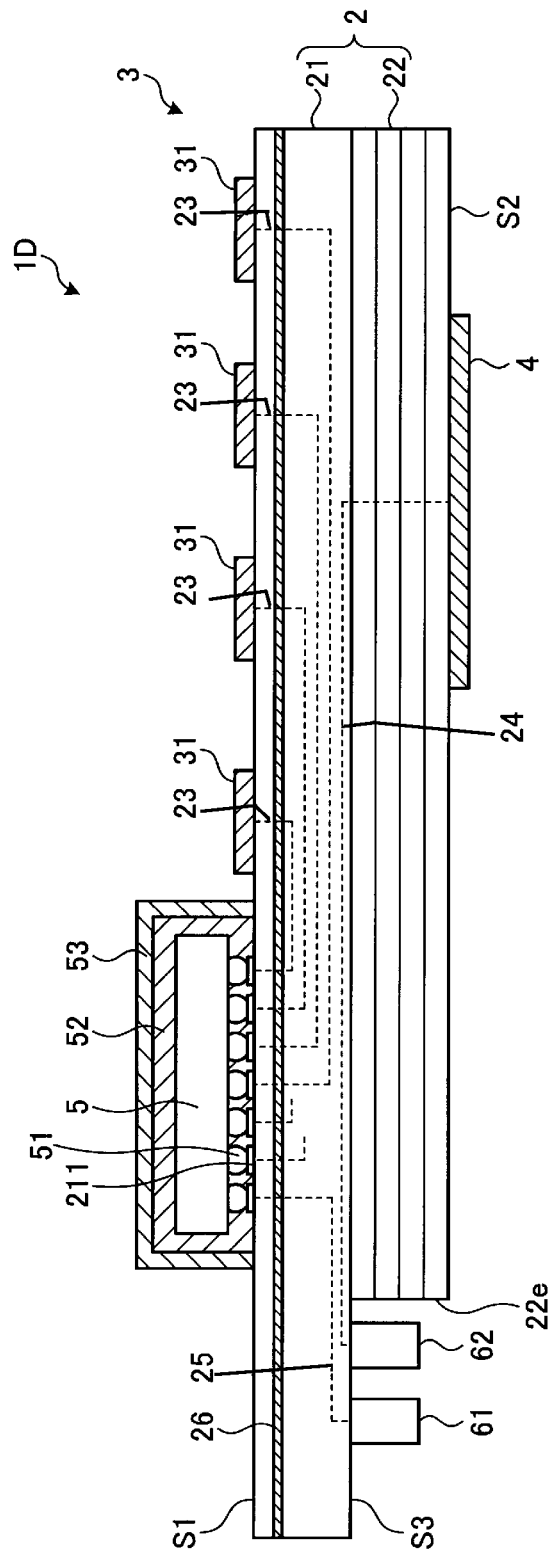
FIG. 7 is a sectional view of an antenna module according to a fourth modification.

FIG. 7 is a sectional view of an antenna module according to a fourth modification. The fourth modification is described in connection with a configuration in which the radio frequency circuit 5 is disposed on the first principal surface S1 of the first dielectric layer 21 unlike the above-described embodiment. As illustrated in FIG. 7, the radio frequency circuit 5 is mounted to a region of the first principal surface S1 where the radiation elements 31 are not disposed. The radio frequency circuit 5 is disposed on an opposite side to the first connector 61 and the second connector 62 with respect to the ground layer 26.

The first signal paths 23 are disposed in the first dielectric layer 21. One-side ends of the first signal paths 23 are connected to the radiation elements 31 on the first principal surface S1, and opposite-side ends of the first signal paths 23 are connected to the radio frequency circuit 5 on the first principal surface S1. The connection path 25 is disposed in the first dielectric layer 21. One end of the connection path 25 is connected to the first connector 61 on the third principal surface S3, and the other end of the connection path 25 is connected to the radio frequency circuit 5 on the first principal surface S1.

The ground layer 26 is disposed between the second antenna 4, the second signal path 24, and the second connector 62 and the radio frequency circuit 5. As a result, the antenna module 1D can suppress the interference between the signal radiated from the second antenna 4 and the radio frequency circuit 5. In other words, the antenna module 1D is less susceptible to the interference of microwave noise.

The configurations of the embodiment and the first to fourth modifications described above can be combined with each other. For example, the antenna modules 1B, 1C and 1D according to the second to fourth modifications may have the configuration in which the resin 52 and the shield layer 53 are not disposed as in the first modification. The antenna modules 1C and 1D according to the third and fourth modifications may have the configuration in which the second antenna 4 is connected to the ground layer 26 as in the second modification. The antenna module 1D according to the fourth modification may have the configuration in which the filter circuit 28 is disposed in the second dielectric layer 22 as in the third modification.

(Fifth Modification)

Figure 8:
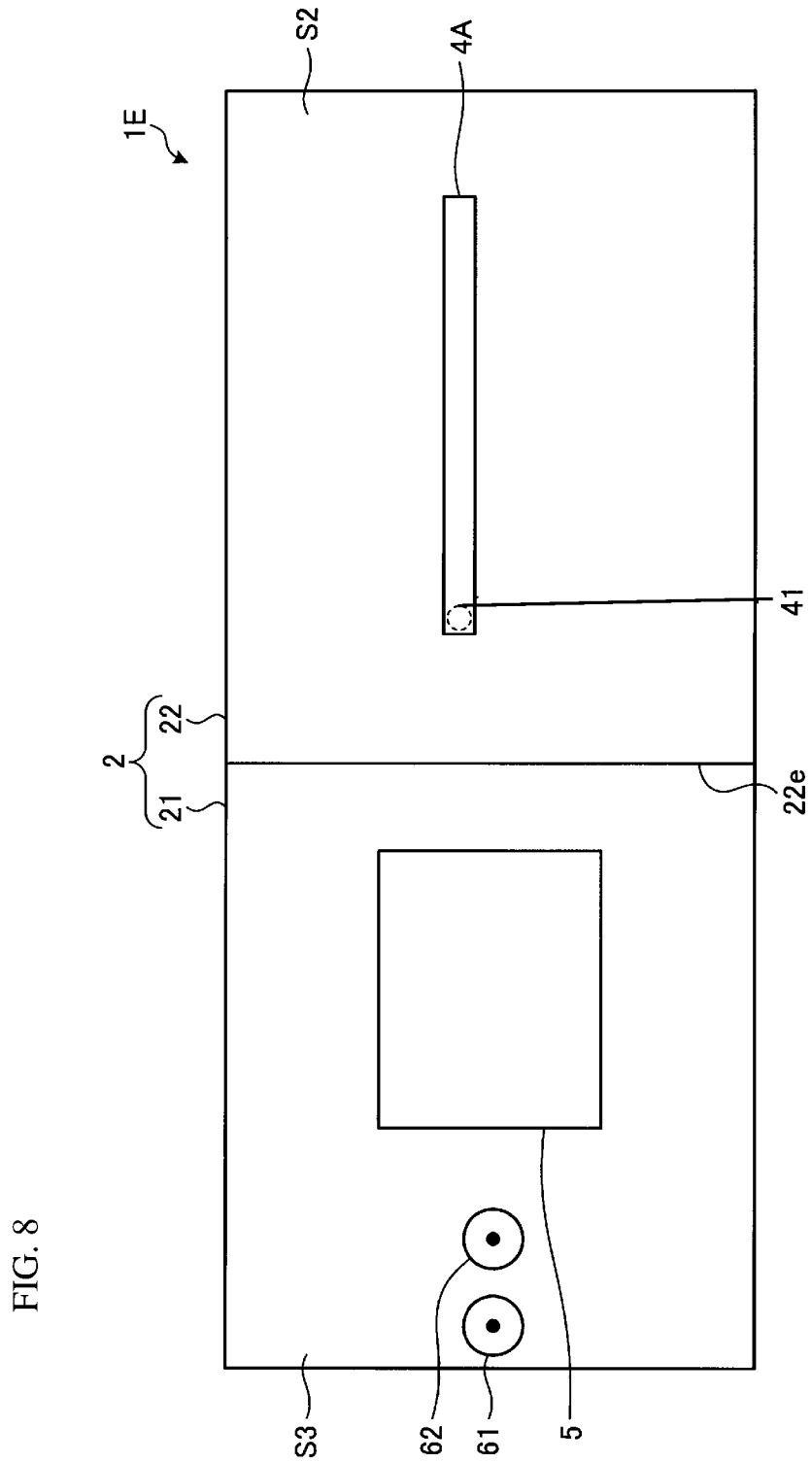
FIG. 8 is a bottom view of an antenna module according to a fifth modification.
Figure 9:
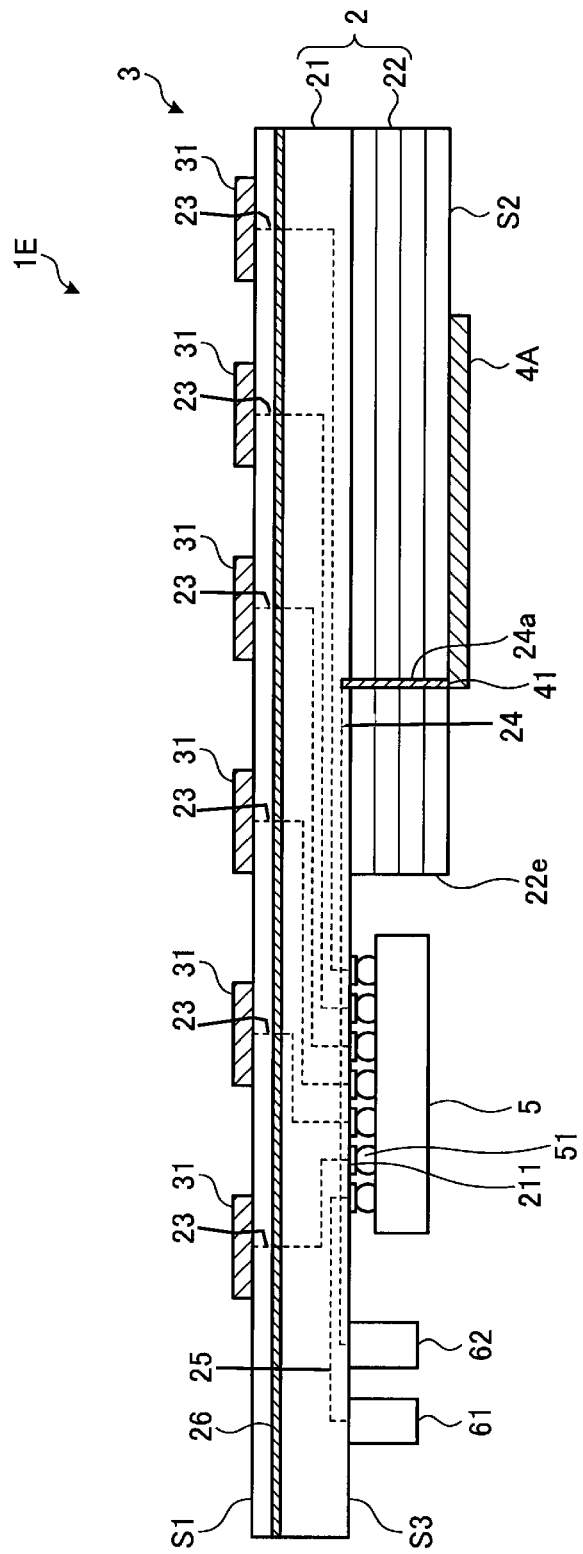
FIG. 9 is a sectional view of the antenna module according to the fifth modification.

FIG. 8 is a bottom view of an antenna module according to a fifth modification. FIG. 9 is a sectional view of the antenna module according to the fifth modification. The fifth modification is described in connection with a configuration in which a second antenna 4A is a monopole antenna unlike the above-described embodiment. As illustrated in FIGS. 8 and 9, the second antenna 4A has a linear shape and extends in a direction perpendicular to the end portion 22e. A feed point 41 is disposed in an end portion of the second antenna 4A on a side closer to the radio frequency circuit 5. A via 24a for the second signal path 24 is formed to extend from the first dielectric layer 21 and through the second dielectric layer 22 in a direction perpendicular to the second principal surface S2 for the connection to the feed point 41.

With the above-described configuration, as in the above-described embodiment, the antenna module 1E according to the fifth modification can transmit and receive the signals of different frequencies in the millimeter wave band and the microwave band, and can suppress the increase in the attenuation of the signal in the millimeter wave band, which is transferred between the radio frequency circuit 5 and the first antenna 3.

(Sixth Modification)

Figure 10:
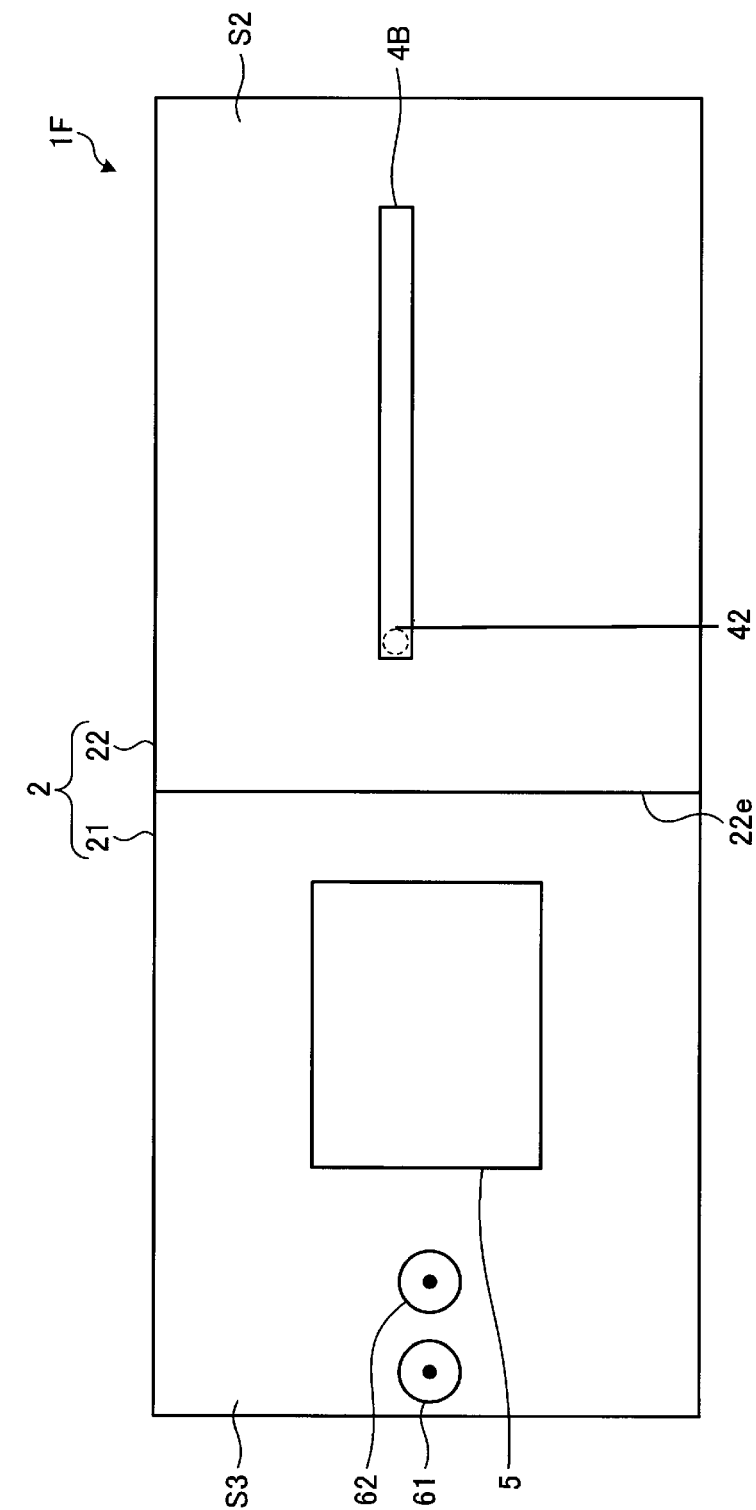
FIG. 10 is a bottom view of an antenna module according to a sixth modification.
Figure 11:
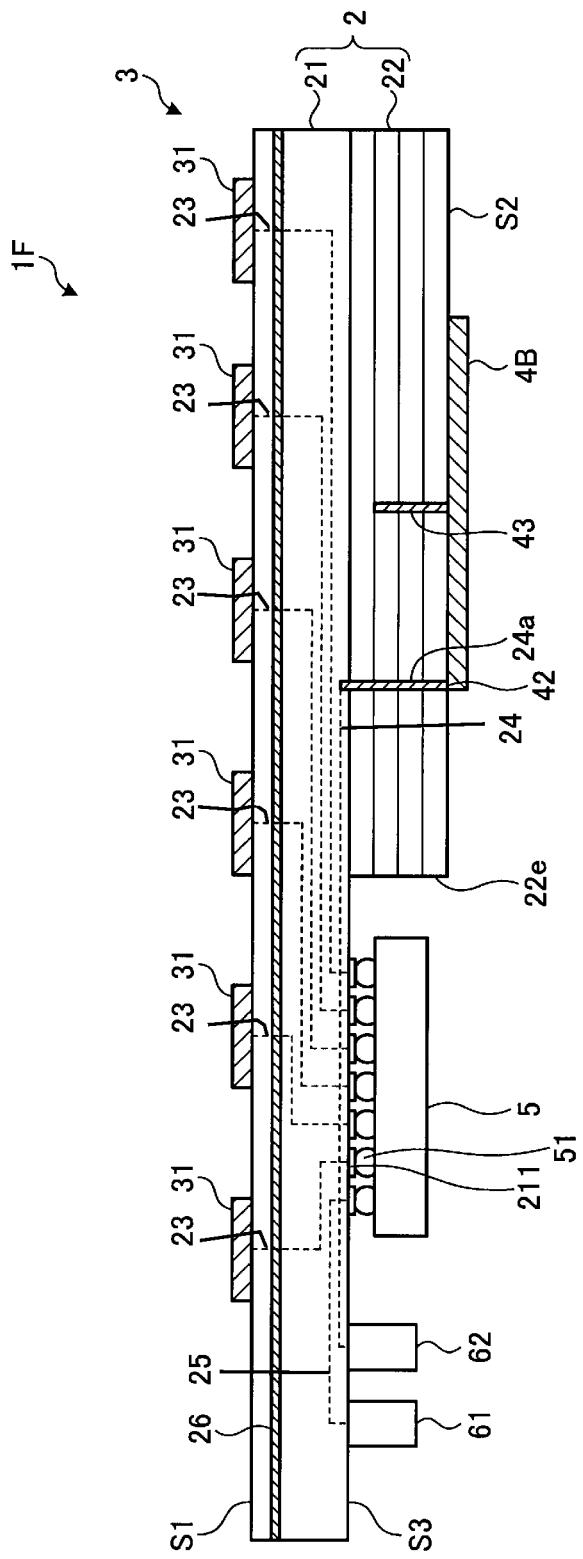
FIG. 11 is a sectional view of the antenna module according to the sixth modification.

FIG. 10 is a bottom view of an antenna module according to a sixth modification. FIG. 11 is a sectional view of the antenna module according to the sixth modification. The sixth modification is described in connection with a configuration in which a second antenna 4B is an inverted-F antenna unlike the above-described embodiment. As illustrated in FIGS. 10 and 11, the second antenna 4B has a linear shape and extends in the direction perpendicular to the end portion 22e. The via 24a for the second signal path 24 is formed for the connection to a feed point 42 that is disposed in the end portion of the second antenna 4B. A short-circuit line 43 is connected to a middle portion of the second antenna 4B. The short-circuit line 43 is disposed in the second dielectric layer 22 to extend in the direction perpendicular to the second principal surface S2. The short-circuit line 43 is formed parallel to the via 24a and shorter than the via 24a.

With the above-described configuration, as in the above-described embodiment, the antenna module 1F according to the sixth modification can transmit and receive the signals of different frequencies in the millimeter wave band and the microwave band, and can suppress the increase in the attenuation of the signal in the millimeter wave band, which is transferred between the radio frequency circuit 5 and the first antenna 3.

(Communication Device)

Figure 12:
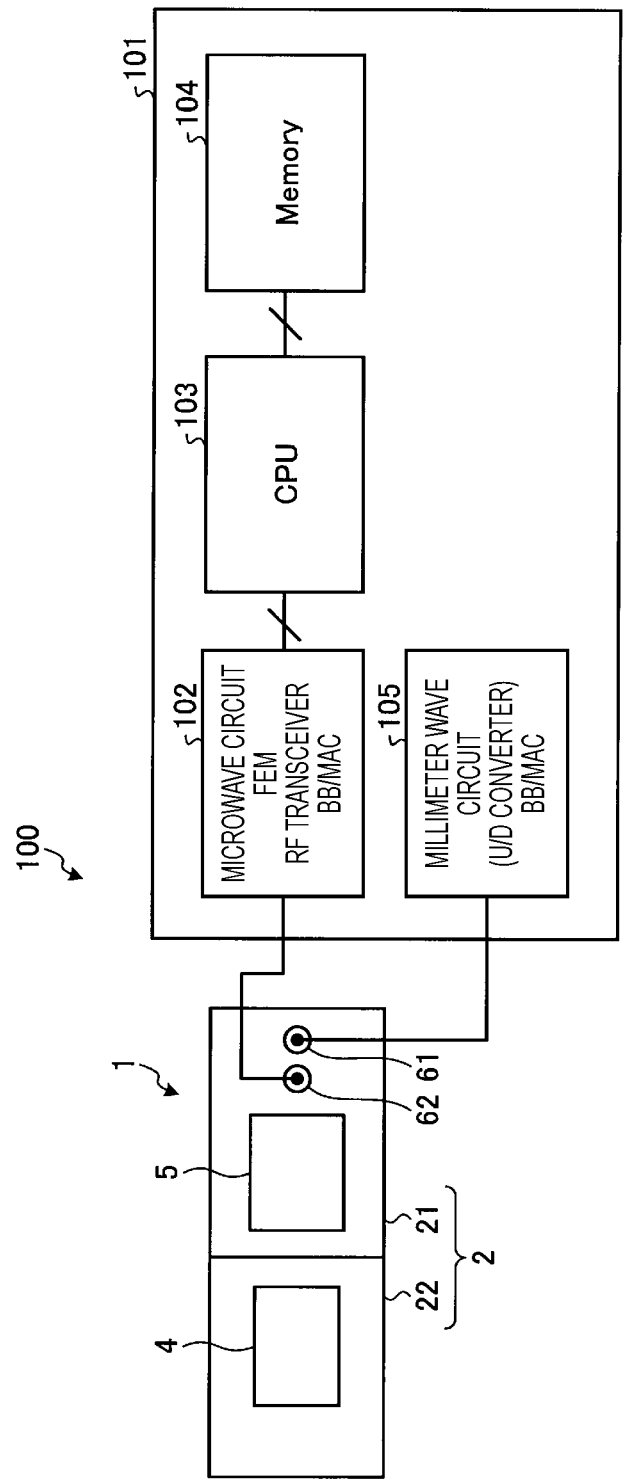
FIG. 12 is a block diagram illustrating a configuration of a communication device that includes the antenna module according to the embodiment.

FIG. 12 is a block diagram illustrating a configuration of a communication device that includes the antenna module according to the embodiment. As illustrated in FIG. 12, the communication device 100 includes the antenna module 1, a mother board 101, a microwave circuit 102, a CPU (Central Processing Unit) 103, a memory 104, and the millimeter wave circuit 105. The microwave circuit 102, the CPU 103, the memory 104, and the millimeter wave circuit 105 are mounted to the mother board 101.

The microwave circuit 102 includes a FEM (Front End Module), an RF transceiver, BB/MAC, and so on. The microwave circuit 102 is connected to the second connector 62 of the antenna module 1.

The millimeter wave circuit 105 includes BB (Base Band)/MAC (Media Access Control), a converter (an up-converter and a down-converter), and so on. The millimeter wave circuit 105 is connected to the first connector 61 of the antenna module 1.

It is to be noted that the above-described embodiments are intended to merely make easier understanding of the present disclosure and not to impose limitations on interpretation of the present disclosure. The present disclosure can be modified and/or improved without departing from the gist of the present disclosure, and equivalents to the matters disclosed herein also fall within the scope of the present disclosure.

1, 1A, 1B, 1C, 1D antenna module
2 substrate
3 first antenna
4 second antenna
5 radio frequency circuit
21 first dielectric layer
22 second dielectric layer
23 first signal path
24 second signal path
25 connection path
26 ground layer
27 ground connection path
28 filter circuit
29a, 29b opposing electrodes
31 radiation element
51 bump
52 resin
53 shield layer
61 first connector
62 second connector
S1 first principal surface
S2 second principal surface
S3 third principal surface

The invention claimed is:

1. An antenna module comprising:
a substrate that includes a first dielectric layer with a first dielectric constant and a second dielectric layer with a second dielectric constant, wherein the second dielectric constant is different from the first dielectric constant;
a first antenna that is disposed on or in the first dielectric layer and that transmits and receives a signal in a first frequency band;
a second antenna that is disposed on or in the second dielectric layer and that transmits and receives a signal in a second frequency band which is a lower frequency band than the first frequency band;
a radio frequency circuit that is disposed on or in the substrate, and that is electrically connected to the first antenna; and
a ground layer that is disposed between the first antenna and the second antenna, the first antenna and the second antenna opposing to each other,
at least part of the first antenna is disposed in a region overlapping with the second antenna in a plan view.

2. The antenna module according to claim 1, wherein the second dielectric constant is higher than the first dielectric constant.

3. The antenna module according to claim 2, wherein the first dielectric layer has a larger area than the second dielectric layer in the plan view.

4. The antenna module according to claim 2, wherein a connector electrically connected to the second antenna is disposed on or in the first dielectric layer.

5. The antenna module according to claim 2, wherein the radio frequency circuit is encapsulated within a resin.

6. The antenna module according to claim 2, further comprising a filter circuit configured to allow at least the signal in the first frequency band to pass therethrough, the filter circuit being disposed on or in the second dielectric layer.

7. The antenna module according to claim 1, wherein the first dielectric layer has a larger area than the second dielectric layer in the plan view.

8. The antenna module according to claim 7, wherein a connector electrically connected to the second antenna is disposed on or in the first dielectric layer.

9. The antenna module according to claim 7, wherein the radio frequency circuit is encapsulated within a resin.

10. The antenna module according to claim 7, further comprising a filter circuit configured to allow at least the signal in the first frequency band to pass therethrough, the filter circuit being disposed on or in the second dielectric layer.

11. The antenna module according to claim 1, wherein a connector electrically connected to the second antenna is disposed on or in the first dielectric layer.

12. The antenna module according to claim 1, wherein the radio frequency circuit is encapsulated within a resin.

13. The antenna module according to claim 12, wherein a shield layer covers the radio frequency circuit encapsulated within the resin.

14. The antenna module according to claim 1, further comprising a filter circuit configured to allow at least the signal in the first frequency band to pass therethrough, the filter circuit being disposed on or in the second dielectric layer.

15. The antenna module according to claim 14, wherein the second dielectric layer and the radio frequency circuit are disposed adjacent to each other on the surface of the first dielectric layer, and
the antenna module includes a signal path that is disposed on or in the first dielectric layer and the second dielectric layer and that connects the first antenna, the filter circuit, and the radio frequency circuit.

16. A communication device comprising:
the antenna module according to claim 1,
a mother board;
a millimeter wave circuit that is disposed on or in the mother board and is connected to the antenna module; and a microwave circuit that is disposed on or in the mother board and is connected to the antenna module.

17. A communication device comprising:
the antenna module according to claim 2,
a mother board;
a millimeter wave circuit that is disposed on or in the mother board and is connected to the antenna module; and
a microwave circuit that is disposed on or in the mother board and is connected to the antenna module.

* * * * *